United States Patent [19]
Letessier et al.

[11] Patent Number: 5,019,794
[45] Date of Patent: May 28, 1991

[54] BANDPASS FILTER HAVING AN ADJUSTABLE BANDWIDTH

[75] Inventors: Jacques Letessier, Suresnes; Philippe Castelli, Paris, both of France

[73] Assignee: U. S. Philips Corporation, New York, N.Y.

[21] Appl. No.: 487,566

[22] Filed: Mar. 2, 1990

[30] Foreign Application Priority Data

Mar. 17, 1989 [FR] France ............................ 89 03523

[51] Int. Cl.$^5$ .............................................. H03H 7/12
[52] U.S. Cl. ..................................... 333/174; 333/175
[58] Field of Search ................. 333/167, 168, 174–176; 307/520, 521; 334/41, 47, 56, 59, 60, 71; 455/188, 286, 339, 340

[56] References Cited

U.S. PATENT DOCUMENTS 4,153,887 5/1979 Poppa ............................. 455/339 X
4,584,544 4/1986 Hettrger ............................. 333/174
4,710,737 12/1987 Matsuta ............................. 455/188 X Primary Examiner—Eugene R. LaRoche
Assistant Examiner—Seung Ham
Attorney, Agent, or Firm—Edward W. Goodman

[57] ABSTRACT

A filter is provided with a capacitive element 6 arranged in shunt across the input, two series-arranged inductive branches 3 and 4 between which a shunting inductive branch 5 is arranged and a capacitive element 7 arranged in shunt across the output. One of the two series-arranged branches includes, in series from the central point 30, a first inductance 3A and a second inductance 3B connected at a point 31 and a capacitor 8 is added in the branch. The shunting branch includes two inductances 5A and 5B which are arranged in series and are interconnected at a point 32. Two diodes, used as switches S1 and S2, one of which is blocked when the other is conducting, are arranged, one between the point 31 and the extermity of series-arranged inductive branch arranged opposite the central point, and the other between the same point 31 and the point 32.

2 Claims, 1 Drawing Sheet

BANDPASS FILTER HAVING AN ADJUSTABLE BANDWIDTH

BACKGROUND OF THE INVENTION

1. Field of the Invention

The invention relates to a bandpass filter having an adjustable bandwidth, comprising a capacitive element arranged in shunt across the input, two series-arranged inductive branches between which a shunted inductive branch is arranged at a central point and a capacitive element arranged in shunt across the output.

Such a filter is used, for example, in the IF amplifier of a receiver for satellite television signals. The bandwidth of the signal is to be adjusted before demodulation to enable this bandwidth to be adapted to the signal-to-noise ratio. This must be done without affecting the gain of the amplifier or the tuning frequency of the filter.

2. Description of the Related Art

If the passband is modified by varying the overvoltages of the industances (in different ratios so as not to change the frequency), the gain also varies. If the passband is modified by changing the coupling, for example, by modifying the value of a shunt element, the tuning frequency varies. In general, it is extremely difficult to vary one parameter without affecting at least one of the other parameters. This is probably the reason which in the prior art has led to the use of two entirely distinct filters used in a switching mode as described in the document JP-Kodai-193416/82.

SUMMARY OF THE INVENTION

The Applicant has found that it is possible to solve the problem by means of one filter. It is characterized in that one of the two series-arranged inductive branches comprises, in series from the central point, a first inductance and a second inductance interconnected at a common point, and a capacitor which is added in the branch, in that the shunted inductive branch comprises two series-arranged inductances interconnected at a connection point and in that two switches one of which is open when the other is closed are arranged, one switch between the common point and the extremity of said series arranged inductive branch arranged opposite the central point and the other switch between the same common point and the connection point.

Advantageously the switches are constituted by diodes and an isolation capacitor is arranged somewhere in the circuit of elements between the common point and the connection point to avoid a dc short circuit of the diodes.

The circuit according to the invention is thus very advantageous in that the desired results are achieved with a great economy of means, and particularly with only two switches.

BRIEF DESCRIPTION OF THE DRAWING

The invention will now be described in greater detail by way of example with reference to the accompanying drawing, in which.

DESCRIPTION OF THE PREFERRED EMBODIMENT

Figure 1:
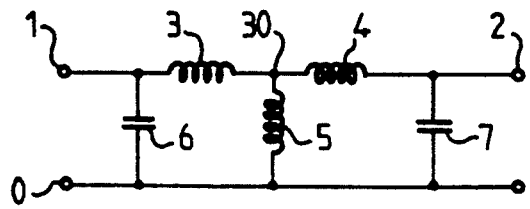
FIG. 1 shows a diagram of the known filter.

The lowpass filter of FIG. 1 of known type is provided with a capacitive element 6 arranged in shunt across the input, two inductive branches 3, 4 arranged in series between the input 1 and the output 2 between which a shunted inductive branch 5 is arranged at a point 30 referred to as central point, and a capacitive element 7 arranged in shunt across the output.

Figure 2:
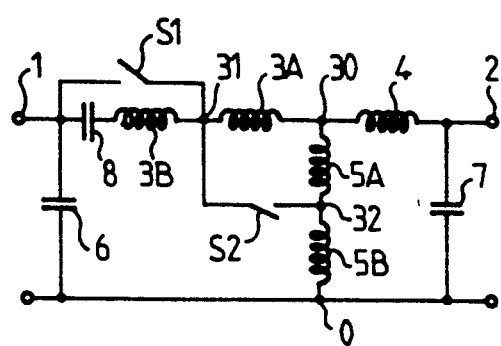
FIG. 2 shows a diagram of a filter according to the invention.

The filter of FIG. 2 is derived from that of FIG. 1 with the following modifications:

the inductive branch 5 is divided into two series-arranged inductances 5A, 5B with a connection point 32 between them;

the inductive branch 3 is not divided but duplicated (this term will be described hereinafter) therewith comprising first and second inductances arranged in series from the central point 30 in the respective order 3A, 3B with a common point 31 between them;

a capacitor is arranged between the inductance 3B and the input 1;

a switch S1 is arranged between the common point 31 and the input 1;

a switch S2 is arranged between the common point 31 and the connection point 32.

When one of the switches is closed, the other is open. The branch 4 is not modified. It should be noted that the problem solved by the invention can also be solved by using the modifications of the assembly 3, 6 for the assembly 4, 7 while leaving the assembly 3, 6 unmodified.

Figure 3:
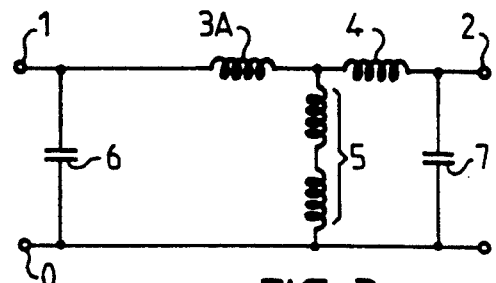
FIG. 3 is the equivalent circuit diagram of the filter of FIG. 2 for a given position of the switches.

FIG. 3 shows the equivalent circuit diagram when the switch S1 is closed and the switch S2 is open. This corresponds to a wide passband. The circuit is identical to that in FIG. 1 in which the inductance 3 is replaced by the inductance 3A; the value of the inductance 5A+5B is equal to the value of the inductance 5. The latter is thus divided into two inductances 5A, 5B.

Figure 4:
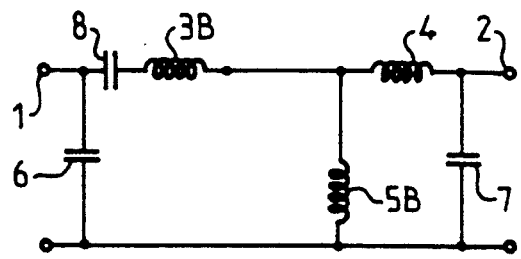
FIG. 4 is the equivalent circuit diagram of the filter of FIG. 2 for another position of the switches.

FIG. 4 shows the circuit for the inverse position of the switches. As compared with FIG. 1, the coupling inductance 5 is diminished and only the part 5B is left: the passband is thus very narrow. The inductance 3 is replaced by the inductance 3B: in none of the configurations of FIGS. 3 and 4 are the two inductances 3A, 3B arranged in series with each other. The inductance 3 is thus not divided into two but duplicated, with each inductance 3A, 3B being used solely each time. A capacitor 8 is arranged in series with the inductance 3B and constitutes, together with the capacitor 6, a tuning capacitor which is different from the capacitor 6 of FIG. 3 in that it has an impedance matching which is different because the input is connected to a terminal between the two capacitors. Due to the modification of the values of the other elements (3A—>3B and 6—>6+8), the central frequency can be maintained, and due to the fact that the input 1 is connected to a terminal between the capacitors 6 and 8, the gain can also be maintained.

It should be noted that the inductance 4 of FIG. 4 need not be exactly the same as that in FIG. 1 because the inductances 3A and 5A of FIG. 2 are now arranged parallel to each other (their terminals 31 and 32 are combined by the switch S2) and in series with the inductance 4. However, as will be evident hereinafter, this is substantially negligible because the value of the inductance 5A is much lower than that of the inductance 4 and this addition to the inductance 4 has a very weak effect. This very weak effect is useful in that the value of the inductance 4 must be a little bit higher when the narrow band is operative, which corresponds exactly to the diagram of FIG. 4.

It could be tried to realize the inductance 3 by dividing rather than duplicating it by means of an initial inductance and an additional inductance which can be short-circuited by means of a switch. In this case the switch S2 would be placed between the points 30 and 32, with the inductance 3A being constantly operative. This solution would not be satisfactory because the circuit constituted by the additional inductance 3B in series with the capacitor 8 constitutes (below the tuning frequency) a capacitive element which would form a rejective element in the passband, in parallel with the parasitic inductance of the diode which constitutes the switch S1 in practice and which would thus be conducting.

Figure 5:
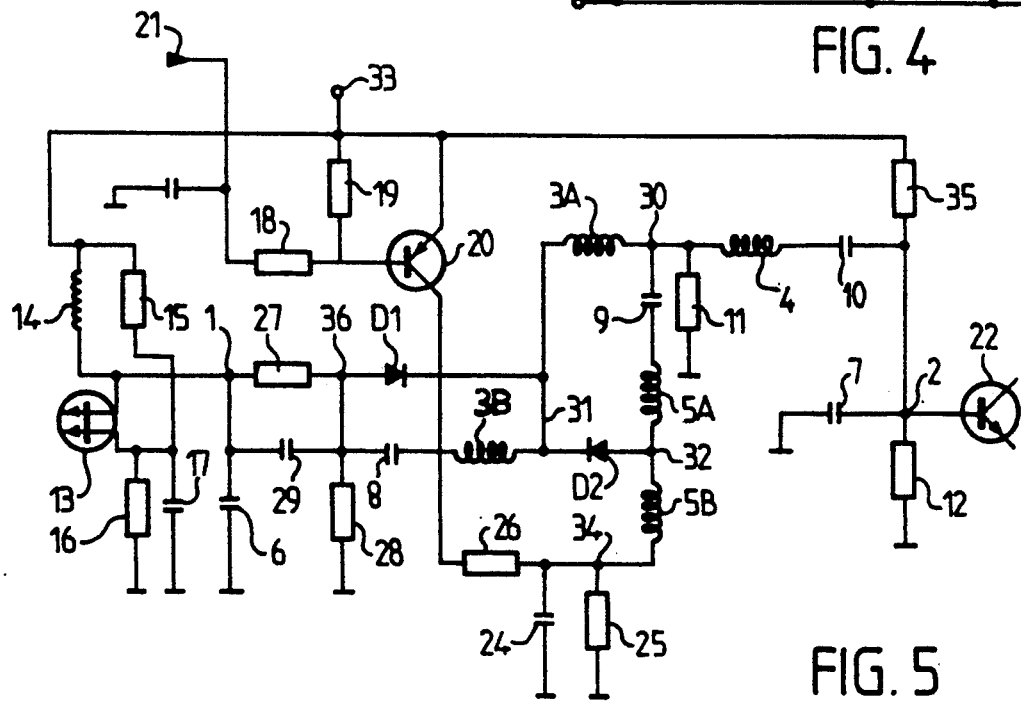
FIG. 5 shows a diagram of a detailed embodiment of a filter according to the invention.

The complete circuit of FIG. 5 comprises the same elements 1, 2, 8, 3B, 3A, 5A, 5B, 4, 30, 31, 32 as those in FIG. 2. For practical reasons of impedance matching, the capacitors 6 and 7 of the previous Figures are now each replaced by two series-arranged capacitors 6, 29 and 7, 10, respectively, constituting capacitive dividers. The input signal of the filter is thus introduced between the capacitors 6 and 29 and the output signal is applied between the capacitors 7 and 10.

In this case the switches are constituted by two diodes D1 and D2 connected in the positions of the switches in FIG. 2. Their cathodes are combined at the common point 31. The other elements are specific of the application to be described hereinafter and can be modified without passing beyond the scope of the invention. The input of the circuit is driven by an N-channel field-effect transistor amplifier 13 whose source is polarized by a resistance bridge 15, 16 arranged between the power supply 33 and ground with a decoupling capacitor 17. The signal is applied to its gates by means of a circuit which is not shown and which does not form part of the invention. Its drain is charged by a blocking inductance 14 connected to the power supply and applies the signal to the input 1 of the filter.

A capacitor 9 is added between the inductance 5A and the central point 30 in order that the diode D2 is not dc short-circuited by the inductances 5A and 3A; it may alternatively be arranged between the inductance 5A and the point 32. Similarly, the capacitor 10 of the impedance matching divider arranged in series with the inductance 4 serves for dc separation. A resistor 27 is arranged in parallel with the capacitor 29: it dc connects the anode of the diode D1 via the inductance 14 to the power supply 33; it hardly influences the behavior of the filter because its impedance is much higher than that of the capacitor 29. The resistor 11 dc connects the cathodes of the diodes to ground. The resistors 27 and 28 constitute a voltage divider between the power supply 33 and ground whose central point 36 determines the dc voltage at the anode of the diode D1. The resistors 12 and 35 determine the polarization of the base of the NPN output amplifier transistor 22.

The PNP transistor 20 of a normal low-frequency type is used for controlling the polarization voltage of the diodes D1, D2 operating as switches. Its base is connected to the common point of a group of two resistors 19, 18 arranged in series and connected to the power supply and to a bandwidth control terminal 21, respectively. The emitter of the transistor 20 is connected to the power supply 33. Its collector is connected to ground by means of a resistance bridge 26, 25 having a central point 34 and decoupled with respect to ground by means of a capacitor 24.

It is necessary that the value of the resistances of the bridges 25, 26 and 28,27 is such that when the transistor 20 is turned on, the voltage at point 34 is at least 0.8 volt higher than that at the common point of the resistors 27,28. Then the diode D2 is conducting and its cathode voltage is higher than that of the anode of D1 which is thus blocked. When the transistor 20 is turned off, the point 34 and thus the anode of D2 are grounded via the resistor 25; the diode D1 is conducting and its cathode thus conveys a voltage which is higher than ground, which blocks D2.

In the example described above, the values indicated in the table have been used for the essential elements of the filter which constitutes one of the filtering elements in an IF amplifier of 480 MHz for receiving D2-MAC/-packet television braodcasts.

The filter is preferably realized in a printed circuit in order to obtain compactness. The inductances 3A,3B,4 and the blocking inductance 14 are discrete elements mounted on the IC, while the inductances 5A,5B of lower value are constituted by printed-circuit tracks. The capacitors and the resistors are miniature models suited for surface mounting. The values used for the inductances are not exactly those provided in theory because they allow for parasitic inductances of the isolation capacitors.

| INDUCTANCES: | RESISTORS: |
| --- | --- |
| 3A: 14 nH | 11: 1,8 kQ |
| 3B: 80 nH | 12: 1 kQ |
| 5A: 1 nH | 25: 22 kQ |
| 5B: 2 nH | 26: 150 Q |
| 4: 45 nH | 27: 2,2 kQ |
| | 28: 4,7 kQ |
| | 35: 3,3 KQ |
| CAPACITORS: | SEMICONDUCTORS: |
| 6: 4,7 pF | D1,D2: BA682 |
| 8: 1,8 pF | |
| 7: 8,2 pF | |
| 9: 100 pF | |
| 10: 2,7 pF | |
| 24: 100 pF | |
| 29: 10 pF | |

We claim:

1. A bandpass filter having an adjustable bandwidth, comprising a first capacitive element arranged in shunt across an input of said bandpass filter; two inductive branches serially arranged between said input and an output of said bandpass filter, said two inductive branches having a central point therebetween; a shunting inductive branch arranged at said central point; and a second capacitive element arranged in shunt across said output, characterized in that one of said two serially-arranged inductive branches comprises, in series from said central point, a first and a second inductances and a capacitor, said first and a second inductances having a common point therebetween; said shunting inductive branch comprising two serially-arranged inductances having a connection point therebetween; and said bandpass filter further comprising a first switch arranged between said common point and an end of said one serially-arranged inductive branch remote from said central point, and a second switch arranged between said common point and said connection point, whereby when one of said first and second switches is open, the other of said first and second switches is closed.

2. A bandpass filter as claimed in claim 1, characterized in that said first and said second switches comprise diodes, and said bandpass filter further comprises an isolation capacitor arranged in series between said two serially-arranged inductances of said shunting inductance branch and said central point.

* * * * *